(12) United States Patent
Buchmann et al.

(10) Patent No.: US 8,234,540 B2
(45) Date of Patent: Jul. 31, 2012

(54) ERROR CORRECTING CODE PROTECTED QUASI-STATIC BIT COMMUNICATION ON A HIGH-SPEED BUS

(75) Inventors: Peter Buchmann, Wald (CH); Kevin C. Gower, LaGrangeville, NY (US); Robert J. Reese, Austin, TX (US); Martin L. Schmatz, Rueschlikon (CH); Michael R. Trombley, Cary, NC (US)

(73) Assignee: International Business Machines Corporation, Armonk, NY (US)

(\*) Notice: Subject to any disclaimer, the term of this patent is extended or adjusted under 35 U.S.C. 154(b) by 1004 days.

(21) Appl. No.: 12/165,788

(22) Filed: Jul. 1, 2008

(65) Prior Publication Data
US 2010/0005365 A1    Jan. 7, 2010

(51) Int. Cl.
*H03M 13/00* (2006.01)
(52) U.S. Cl. ........ 714/758; 714/752; 375/221; 375/224; 370/241
(58) Field of Classification Search .................. 714/758; 375/221, 224; 370/241
See application file for complete search history.

(56) References Cited

U.S. PATENT DOCUMENTS

| | | | |
|---|---|---|---|
| 4,034,195 A | 7/1977 | Bates | |
| 4,376,306 A | 3/1983 | Giusto | |
| 4,468,770 A | 8/1984 | Metcalf et al. | |
| 4,631,686 A | 12/1986 | Ikawa et al. | |
| 4,644,498 A | 2/1987 | Bedard et al. | |
| 4,775,979 A | 10/1988 | Oka | |
| 5,321,813 A | 6/1994 | McMillen et al. | |
| 5,513,135 A | 4/1996 | Dell et al. | |
| 6,067,262 A | 5/2000 | Irrinki et al. | |
| 6,070,256 A | 5/2000 | Wu et al. | |
| 6,119,181 A | 9/2000 | Vorbach et al. | |
| 6,147,967 A | 11/2000 | Ying et al. | |
| 6,201,829 B1 * | 3/2001 | Schneider | 375/221 |
| 6,297,995 B1 | 10/2001 | McConnell et al. | |
| 6,308,286 B1 | 10/2001 | Richmond et al. | |
| 6,337,817 B1 | 1/2002 | Horiguchi et al. | |
| 6,338,154 B2 | 1/2002 | Kim | |

(Continued)

FOREIGN PATENT DOCUMENTS
EP        1622020 A2    2/2006
(Continued)

OTHER PUBLICATIONS

G. Boudon et al., "Novel Bus Reconfiguration Scheme With Spare Lines", IBM Technical Bulletin, May 1987, pp. 5590-5593.

(Continued)

*Primary Examiner* — Sam Rizk
(74) *Attorney, Agent, or Firm* — Cantor Colburn LLP

(57) ABSTRACT

A communication interface device, system, method, and design structure for error correcting code (ECC) protected quasi-static bit communication (SBC) on a high-speed bus are provided. The communication interface device includes high-speed sampling logic to capture high-speed data from the high-speed bus using a high-speed sampling clock and SBC sampling logic to capture SBC samples from the high-speed bus using an SBC sampling clock. The SBC sampling clock is slower than the high-speed sampling clock. The communication interface device also includes an SBC finite state machine (FSM) to detect a received SBC command in response to a static pattern persisting for a predetermined number of the SBC samples and command decoding logic to decode the received SBC command.

18 Claims, 7 Drawing Sheets

U.S. PATENT DOCUMENTS

| | | |
|---|---|---|
| 6,367,042 B1 | 4/2002 | Phan et al. |
| 6,381,685 B2 | 4/2002 | Dell et al. |
| 6,430,715 B1 * | 8/2002 | Myers et al. .................. 714/704 |
| 6,518,593 B2 | 2/2003 | Takabayashi et al. |
| 6,526,461 B1 | 2/2003 | Cliff |
| 6,531,339 B2 | 3/2003 | King et al. |
| 6,789,212 B1 | 9/2004 | Klingman |
| 6,865,222 B1 * | 3/2005 | Payne .......................... 375/224 |
| 6,895,528 B2 | 5/2005 | Cantwell et al. |
| 6,931,564 B2 | 8/2005 | Goodman et al. |
| 6,973,605 B1 | 12/2005 | Templeton et al. |
| 7,013,416 B2 | 3/2006 | Whetsel |
| 7,058,918 B2 | 6/2006 | Abramovici et al. |
| 7,069,494 B2 | 6/2006 | Cargnoni et al. |
| 7,154,723 B1 | 12/2006 | Warnakulasooriya et al. |
| 7,168,005 B2 | 1/2007 | Adams et al. |
| 7,178,076 B1 | 2/2007 | Zarrineh et al. |
| 7,181,659 B2 | 2/2007 | Bravo et al. |
| 7,277,346 B1 | 10/2007 | Rahim et al. |
| 7,293,221 B1 * | 11/2007 | Wong et al. .................. 714/768 |
| 7,299,313 B2 | 11/2007 | Gower et al. |
| 7,334,149 B1 | 2/2008 | Wu |
| 7,343,535 B2 * | 3/2008 | Lai ............................... 714/724 |
| 7,353,316 B2 | 4/2008 | Erdmann |
| 7,362,697 B2 | 4/2008 | Becker et al. |
| 7,853,849 B2 * | 12/2010 | Kurayama .................... 714/738 |
| 2002/0024455 A1 | 2/2002 | Abbiate et al. |
| 2002/0075982 A1 | 6/2002 | Doblar |
| 2003/0074619 A1 | 4/2003 | Dorsey |
| 2003/0185251 A1 | 10/2003 | Ichino et al. |
| 2004/0180455 A1 | 9/2004 | Marr |
| 2004/0190331 A1 | 9/2004 | Ross et al. |
| 2004/0216026 A1 | 10/2004 | Ferraiolo et al. |
| 2004/0250181 A1 | 12/2004 | Vogt et al. |
| 2005/0138496 A1 | 6/2005 | Brennan et al. |
| 2005/0174138 A1 | 8/2005 | Marr |
| 2005/0210185 A1 | 9/2005 | Renick |
| 2005/0223196 A1 | 10/2005 | Knowles |
| 2005/0246597 A1 | 11/2005 | Whetsel |
| 2006/0036827 A1 | 2/2006 | Dell et al. |
| 2006/0095620 A1 | 5/2006 | Dreps et al. |
| 2006/0107175 A1 | 5/2006 | Dell et al. |
| 2006/0179369 A1 | 8/2006 | Bravo et al. |
| 2006/0179394 A1 | 8/2006 | O'Neill et al. |
| 2006/0218455 A1 | 9/2006 | LeClair et al. |
| 2006/0277363 A1 | 12/2006 | Qui et al. |
| 2007/0011562 A1 | 1/2007 | Alexander et al. |
| 2007/0075734 A1 | 4/2007 | Ramos et al. |
| 2007/0204190 A1 | 8/2007 | Hesse et al. |
| 2007/0248018 A1 * | 10/2007 | Ranallo et al. ................. 370/241 |
| 2007/0283223 A1 | 12/2007 | Dell et al. |
| 2007/0288816 A1 | 12/2007 | Nakanishi |
| 2007/0300129 A1 | 12/2007 | Dell et al. |
| 2008/0005644 A1 | 1/2008 | Dell |
| 2008/0022186 A1 | 1/2008 | Co et al. |
| 2008/0028345 A1 | 1/2008 | Suri et al. |
| 2008/0046774 A1 | 2/2008 | Hirai et al. |
| 2008/0046796 A1 | 2/2008 | Dell et al. |
| 2008/0065938 A1 | 3/2008 | Cowell et al. |
| 2008/0115137 A1 | 5/2008 | Gower et al. |
| 2008/0192814 A1 * | 8/2008 | Hafed et al. .................. 375/224 |

FOREIGN PATENT DOCUMENTS

| | | |
|---|---|---|
| JP | 02-307254 | 12/1990 |
| JP | 03-234125 | 10/1991 |
| JP | 09-261210 | 10/1997 |

OTHER PUBLICATIONS

Sunggu Lee, et al., "Probabilistic Diagnosis of Multiprocessor Systems", ACM Computing Surveys, Mar. 1994, pp. 121-139, vol. 26, No. 1.

Alan Charlesworth et al., "The Starfire SMP Interconnect", 1997, pp. 1-20, ACM.

Daniele Rossi et al., "New ECC for Crosstalk Impact Minimization", Jul./Aug. 2005, pp. 340-348 IEEE CS and the IEEE CASS.

Smitha Shyam et al., "Ultra Low-Cost Defect Protection for Microprocessor Pipelines", ASPLOS' 06, Oct. 21-25, 2006, pp. 73-82, ACM, San Jose, California, USA.

D.M Berger et al., "High-Speed source-synchronous interface for the IBM System z9 processor" IBM J. Res & Dev., Jan. 2007, pp. 53-64, vol. 51, No. 1/2, IBM.

FBDIMM: Architecture and Protocal, Jan. 2007, JESD206, JEDEC Solid State Technology Association, Arlington, VA USA.

* cited by examiner

ERROR CORRECTING CODE PROTECTED QUASI-STATIC BIT COMMUNICATION ON A HIGH-SPEED BUS

BACKGROUND

This invention relates generally to computer system communications, and more particularly to providing error correcting code protected quasi-static bit communication on a high-speed bus.

Contemporary high performance computing main memory systems are generally composed of one or more dynamic random access memory (DRAM) devices, which are connected to one or more processors via one or more memory control elements. Overall computer system performance is affected by each of the key elements of the computer structure, including the performance/structure of the processor(s), any memory cache(s), the input/output (I/O) subsystem(s), the efficiency of the memory control function(s), the main memory device(s), and the type and structure of the memory interconnect interface(s).

Extensive research and development efforts are invested by the industry, on an ongoing basis, to create improved and/or innovative solutions to maximizing overall system performance and density by improving the memory system/subsystem design and/or structure. High-availability systems present further challenges as related to overall system reliability due to customer expectations that new computer systems will markedly surpass existing systems in regard to mean-time-between-failure (MTBF), in addition to offering additional functions, increased performance, increased storage, lower operating costs, etc. Other frequent customer requirements further exacerbate the memory system design challenges, and include such items as ease of upgrade and reduced system environmental impact (such as space, power and cooling).

SUMMARY

An exemplary embodiment is a communication interface device that includes high-speed sampling logic to capture high-speed data from a high-speed bus using a high-speed sampling clock and static bit communication (SBC) sampling logic to capture SBC samples from the high-speed bus using an SBC sampling clock. The SBC sampling clock is slower than the high-speed sampling clock. The communication interface device also includes an SBC finite state machine (FSM) to detect a received SBC command in response to a static pattern persisting for a predetermined number of the SBC samples and command decoding logic to decode the received SBC command.

Another exemplary embodiment is a memory system that includes a memory controller with transmitting circuitry. The transmitting circuitry includes SBC transmission logic to generate SBC transmission data, where the SBC transmission data includes a static pattern held static for multiple unit intervals of a high-speed clock. The transmitting circuitry further includes a multiplexer to select a data source to transmit as a one of high-speed transmission data and the SBC transmission data. The memory system also includes a memory buffer in communication with the memory controller via a high-speed bus. The memory buffer includes receiving circuitry with high-speed sampling logic to capture high-speed data from the high-speed bus using the high-speed clock as a high-speed sampling clock, and SBC sampling logic to capture SBC samples from the high-speed bus using an SBC sampling clock. The SBC sampling clock is slower than the high-speed sampling clock. The receiving circuitry additionally includes an SBC FSM to detect a received SBC command in response to a received static pattern persisting for a predetermined number of the SBC samples.

A further exemplary embodiment is a method for providing error correcting code protected SBC. The method includes capturing SBC samples from a high-speed bus, where the SBC samples include ECC check bits and SBC patterns. The method further includes checking the ECC check bits using an ECC decoder and outputting the SBC patterns. In response to detecting an errant SBC sample, the ECC decoder attempts to correct the associated SBC pattern. The method also includes detecting a received SBC command in response to a static pattern persisting in the SBC patterns for a predetermined number of the SBC samples, and decoding the received SBC command.

An additional exemplary embodiment is a design structure tangibly embodied in a machine-readable medium for designing, manufacturing, or testing an integrated circuit. The design structure includes high-speed sampling logic to capture high-speed data from a high-speed bus using a high-speed sampling clock and SBC sampling logic to capture SBC samples from the high-speed bus using an SBC sampling clock. The SBC sampling clock is slower than the high-speed sampling clock. The design structure further includes an SBC FSM to detect a received SBC command in response to a static pattern persisting for a predetermined number of the SBC samples, and command decoding logic to decode the received SBC command.

Other systems, methods, apparatuses, design structures and/or computer program products according to embodiments will be or become apparent to one with skill in the art upon review of the following drawings and detailed description. It is intended that all such additional systems, methods, apparatuses, design structures and/or computer program products be included within this description, be within the scope of the present invention, and be protected by the accompanying claims.

BRIEF DESCRIPTION OF THE SEVERAL VIEWS OF THE DRAWINGS

Referring now to the drawings wherein like elements are numbered alike in the several FIGURES.

DETAILED DESCRIPTION

Figure 1:
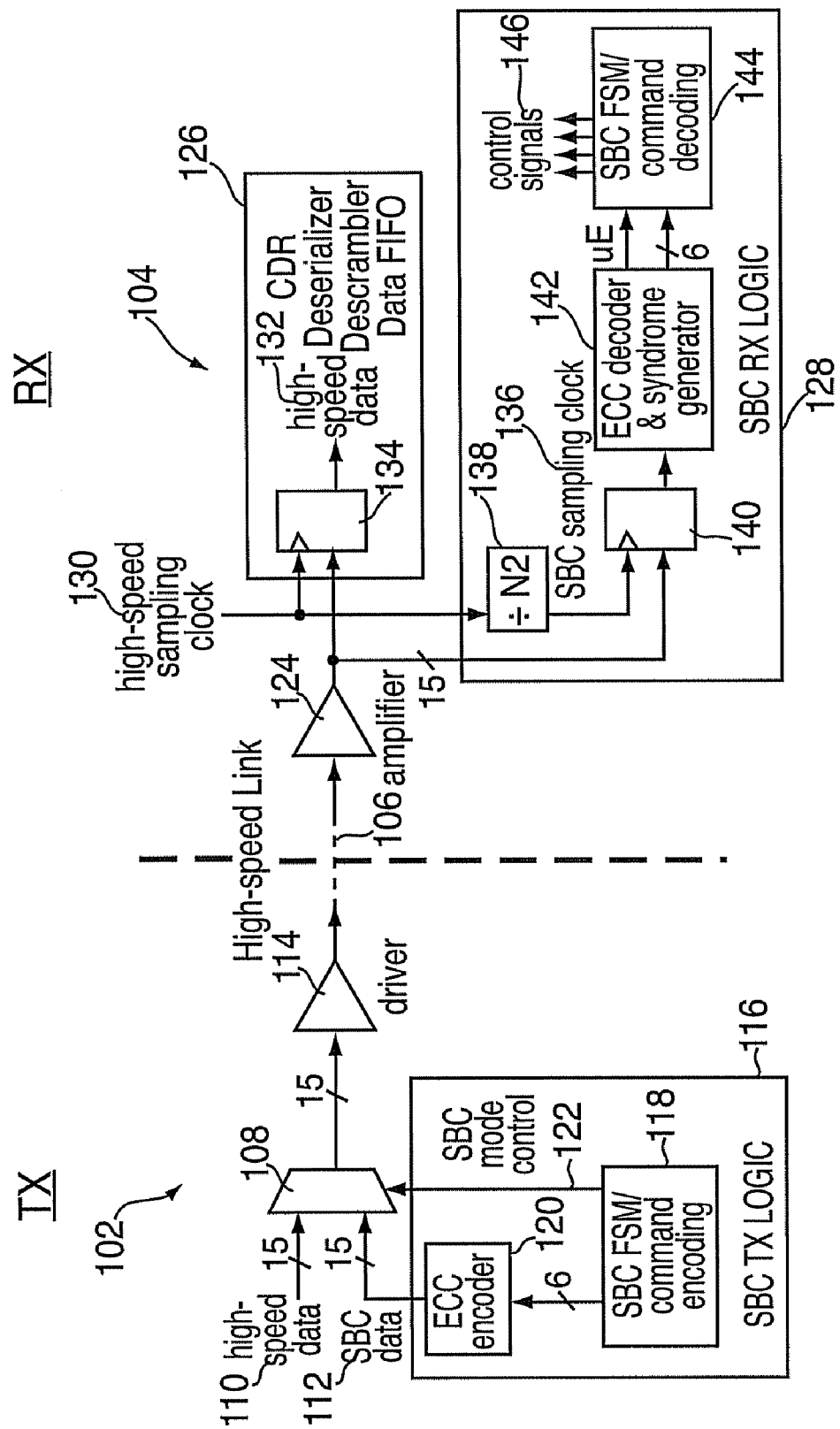
FIG. 1 depicts an example of a transmitter and receiver configuration for quasi-static bit communication that may be implemented by exemplary embodiments.

A high-speed bus may be used to communicate between memory modules in a memory system to increase memory system performance. Before the high-speed bus can be used to reliably communicate between the memory modules, configuration data may be exchanged between memory system components. In-band set-up and configuration methods transfer control information in frame headers, control packets or commands at a high-speed data rate to the memory modules. However, issues arise when high-speed data cannot be reliably transmitted, which may occur in conditions such as system start-up, link setup and training, or interconnect reset, leading to extended delays as operations are retried until successful.

In an exemplary embodiment, error correcting code protected quasi-static bit communication on a high-speed data bus is provided. Using quasi-static bit communication allows commands to be recognized when a sufficient number of bits remain static for a predetermined period of time without precise timing calibration that may be required for high-speed communication. Applying an error correcting code enables failures to be detected and corrected for a large number of commands.

The invention as described herein provides error correcting code protected quasi-static bit communication on a high-speed bus that includes high-speed links. Quasi-static bit communication, also referred to as "static bit communication" or "SBC", can be used to control the sequence of link initialization and training phases to establish reliable communication on the high-speed bus. When error correction of an SBC sample is performed prior to checking for a static pattern, the error correction may be able to repair errors that would otherwise prevent the pattern from being static over a period of time. Thus there is an increased tolerance for errors and only a portion of the SBC sample needs to remain static for a predetermined period of time. In an exemplary embodiment, a large number of commands and transmission of setup data are used to control training sequences of the high-speed links to calibrate high-speed communication. The high-speed links may connect a number of daisy-chained devices, such as fully buffered memory channels of computer systems.

Reliability is improved by using a low-speed clock derived from a high-speed clock, as well as a sample counter to confirm that a sufficient number of bits on the high-speed bus have remained static for a predetermined period of time. The static bits may be used to distinguish SBC data from standard high-speed data communicated on the high-speed bus. The low-speed clock enables the transfer of data for configuration, training and calibration without additional clock conditioning, such as a phase locked-loop (PLL), which may be required for sampling reliably at the high-speed clock rate. Further reliability features may include the use of spare lanes to switch out defective bit lanes (e.g., bus wires) and clocks, as well as an error correcting code (ECC) for detection and repair of failed bit lanes. ECC protection allows identification of failing lanes. ECC codes can be designed to be able to repair transmitted data (error correction) and can further be enhanced in a way to detect a higher number of failures than what can be repaired (error detection). The latter feature is important in order not to attempt a repair in the presence of to many failures. Further repair counter-measures may be performed using the spare lanes.

In an exemplary embodiment, SBC is implemented as an SBC mode of operation for communicating on the high-speed bus at a reduced rate. A high-speed mode of operation also uses the high-speed bus for communicating at a high nominal speed. SBC mode transmitters drive an unscrambled, quasi-static bit pattern onto the high-speed bus for a large number (N0) of unit intervals (UI) or high-speed sample times. High-speed bus receivers include detection circuitry for a static pattern that includes repowering, latching, correction and decoding. In contrast, the high-speed mode of operation may use scrambled data patterns to achieve the transition density for maintaining bit lock. Switching bits pseudo-randomly for the high-speed mode provides '1' to '0' and '0' to '1' transitions even during extended idle times on the memory channel. These transitions can also prevent receiving circuitry from inadvertently mistaking idle time in high-speed mode as an SBC command.

An example of a high-speed link with SBC circuitry is depicted in the block diagram of FIG. 1. Transmitting circuitry 102 transmits data to receiving circuitry 104 on a high-speed link 106. The transmitting circuitry 102 includes a multiplexer (mux) 108 that can send either high-speed data 110 or SBC data 112 to driver 114 to output on the high-speed link 106. The transmitting circuitry 102 may be included in a communication interface device, such as a memory interface device, for instance, a memory controller, buffer or hub, to transmit either the high-speed data 110 or the SBC data 112 to the receiving circuitry 104. Similarly, the receiving circuitry 104 may be included a communication interface device, such as a memory interface device, for instance, a memory controller, buffer or hub, to receive the high-speed data 110 and the SBC data 112. The high-speed data 110 may include serialized frames of addresses, commands and data for reading or writing data, e.g., targeting memory devices on a memory module. The SBC data 112 can include both commands (with or without additional data) and ECC bits as generated by SBC transmission logic 116.

In an exemplary embodiment, the SBC transmission logic 116 includes SBC finite state machine (FSM) and command encoding logic 118 that drives an ECC encoder 120 and provides SBC mode control 122 to select between the inputs to the mux 108. Although the SBC FSM and command encoding logic 118 is depicted as a single functional block, it will be understood that it can be subdivided into separate functional blocks. The SBC FSM and command encoding logic 118 can determine a particular command to send based upon a sequence of training states used to configure characteristics of devices coupled to the high-speed link 106. In the example depicted in FIG. 1, six bits of SBC commands are output to the ECC encoder 120. The ECC encoder 120 generates ECC check bits to detect and correct for error conditions. In an exemplary embodiment, the ECC encoder 120 produces a double error correcting, triple error detecting (DEC/TED) ECC with (15,6) binary encoding, where 9 bits are dedicated to the ECC. While the example depicted in FIG. 1 includes 6-bit SBC commands and 15-bit values transmitted from the transmitting circuitry 102 to the receiving circuitry 104, it will be understood that other bus widths, including SBC command and ECC widths are included within the scope of the invention.

The receiving circuitry 104 may include an amplifier 124 to repower data received on the high-speed link 106. The amplifier 124 can output data to both clock and data recovery (CDR) logic 126 and SBC receiver logic 128. The CDR logic 126 and the SBC receiver logic 128 receive a high-speed sampling clock 130 for sampling data from the high-speed link 106. The CDR 126 performs processing of high-speed data 132, which is captured via high-speed sampling logic 134. The CDR 126 may also include deserializing and descrambling logic to further condition the high-speed data 132 that corresponds to the high-speed data 110.

The SBC receiver logic 128 derives SBC sampling clock 136 from the high-speed sampling clock 130, using clock divider 138. In the example depicted in FIG. 1, the clock divider 138 divides the high-speed sampling clock 130 by a factor of N2. The SBC sampling clock 136 drives the SBC sampling rate for SBC sampling logic 140, which captures data output from the amplifier 124. An ECC decoder and syndrome generator 142 extracts the ECC check bits added by the ECC encoder 120 and generates a 9-bit syndrome, and performs error detection and/or correction on the SBC command received. Although the ECC decoder and syndrome generator 142 is depicted as a single functional block, it will be understood that it can be subdivided into separate functional blocks. The resulting SBC command is passed to SBC FSM/command decoding logic 144 to decode the SBC command as generated by the SBC FSM/command encoding logic 118. Again, while the SBC FSM/command encoding logic 118 is depicted as a single functional block, it will be understood that it can be subdivided into separate functional blocks. The ECC decoder and syndrome generator 142 may also provide the SBC FSM/command decoding logic 144 with error information to assist in decoding the SBC command, e.g., to prevent reliance on an uncorrectable error (UE) in the SBC command. The SBC FSM/command decoding logic 144 outputs control signals 146 which may drive other circuitry (not depicted).

SBC commands are only valid if a static pattern is detected for at least N1 UI, where N1<N0. SBC sampling is performed in parallel to the normal, full-speed data samples. The SBC sampling logic 140 acquires SBC samples every N2 UI, where 1 UI<N2<N1. This scheme of sampling at a reduced rate facilitates timing closure in a link system that is not yet set up for reliable high-speed operation. Thus, when the SBC TX logic 116 drives SBC commands with ECC over the high-speed link 106 for at least N0 UI, the SBC RX logic 128 need only detect a quasi-static pattern for the predetermined time period of N1 UI to confirm that an SBC command has been received. The difference between N0 and N1 can allow for settling and transition time between modes of operation. For example, the SBC TX logic 116 may output the SBC data 112 for 512 UI (where N0=512 UI) and the SBC RX logic 128 may only need 48 UI (where N1=48 UI) to confirm that an SBC command has been received.

ECC protection of the SBC protocol allows error detection and correction, and efficient use of spare lanes. In daisy-chain configurations, such as in buffered memory channels, the SBC code is corrected in each receiver before repowered and driven onto the next link segment. One example of an ECC algorithm that can be used by the ECC encoder 120 and the ECC decoder and syndrome generator 142 is a DEC/TED ECC. Referring to the 15-bit lane example of FIG. 1, the DEC/TED ECC uses the 15 rightmost bits of a [16,7] encoding resulting in 6 corrected data bits from the 15 SBC lanes. Signal strands 14 down to 9 carry the data bits, SBC(5:0) and strands 8 down to 0 carry the check bits CB(8:0). The code is defined by the following parity check matrix 9×16 HGEN:
1101000100000000
0110100010000000
0011010001000000
0001101000100000
1101110000010000
0110111000001000
1110011000000100
1010001000000010
1001111000000001
Note that the last 9 columns of HGEN form an identity matrix that represents the check bits. Each check bit is generated by XORing the data bits at positions indicated by the ones in the corresponding row vector in HGEN, (with leftmost column assumed zero).

$CB(8)=SBC(5)\char`\^SBC(3)$ $CB(7)=SBC(5)\char`\^SBC(4)\char`\^SBC(2)$ $CB(6)=SBC(4)\char`\^SBC(3)\char`\^SBC(1)$ $CB(5)=SBC(3)\char`\^SBC(2)\char`\^SBC(0)$ $CB(4)=SBC(5)\char`\^SBC(3)\char`\^SBC(2)\char`\^SBC(1)$ $CB(3)=SBC(5)\char`\^SBC(4)\char`\^SBC(2)\char`\^SBC(1)\char`\^SBC(0)$ $CB(2)=SBC(5)\char`\^SBC(4)\char`\^SBC(1)\char`\^SBC(0)$ $CB(1)=SBC(4)\char`\^SBC(0)$ $CB(0)=SBC(3)\char`\^SBC(2)\char`\^SBC(1)\char`\^SBC(0)$ When 15-bit data is received at the ECC decoder and syndrome generator 142, a 9-bit syndrome is generated. The syndrome is logically the received check bits XORed with the check bits regenerated from the received data. Syndrome decoding is used to determine if there are errors in the received data. If there are errors, the syndrome is decoded to indicate the error positions so that the erroneous data bits can be corrected.

Figure 2:
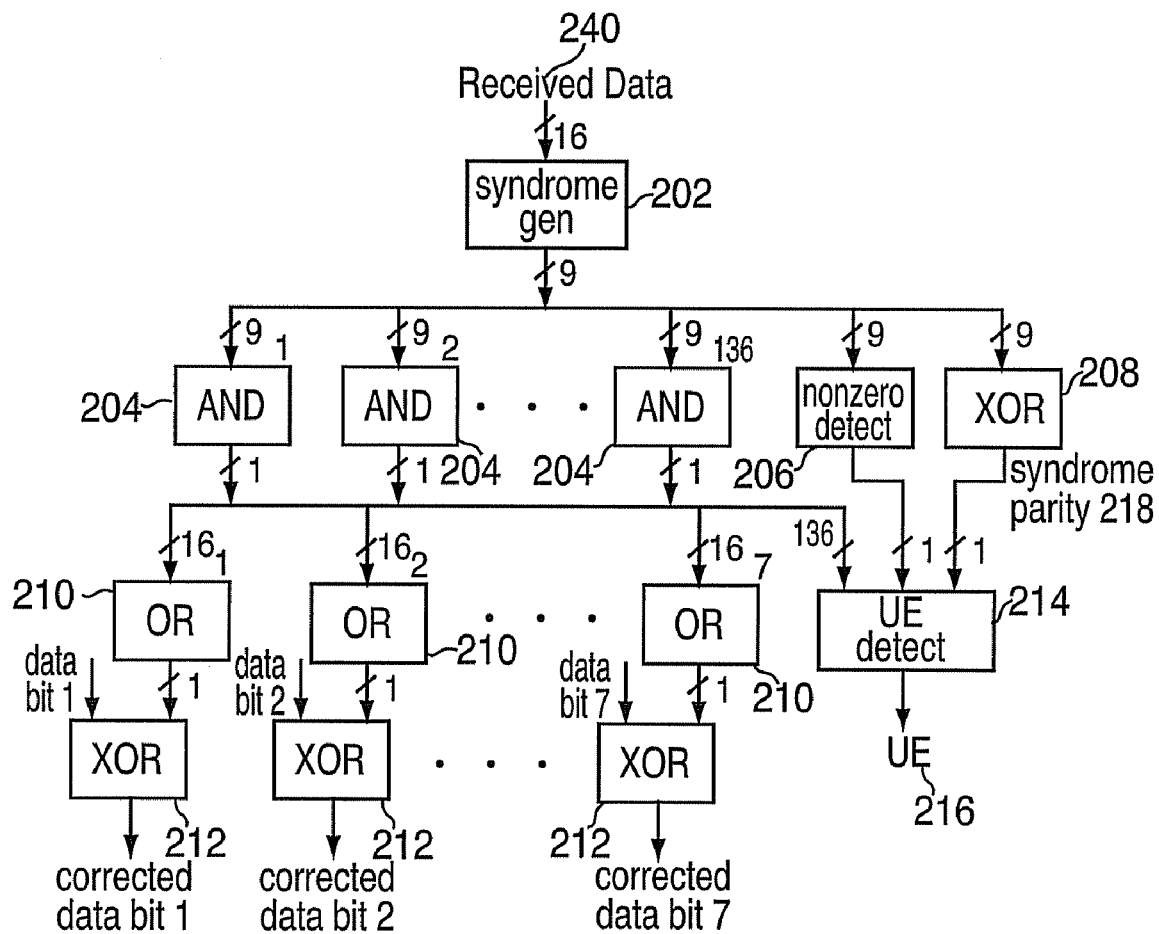
FIG. 2 depicts a block diagram for error correcting logic that may be implemented by exemplary embodiments.

FIG. 2 depicts a block diagram for error correcting logic that may be implemented by the ECC decoder and syndrome generator 142 of FIG. 1. Syndrome generator 202 can generate a syndrome as previously described, where received data 240 is an SBC sample. Although the example depicted in FIG. 1 uses 15 bits, the syndrome generator 202 can support a greater number of bits, e.g., 16 bits, where the 16th bit of the received data 240 may be forced to a value of zero. The resulting syndrome value from the syndrome generator 202 is passed to multiple AND circuits 204, nonzero detect 206 and XOR circuit 208. If all syndrome bits are zero, there is no error; otherwise, there is an error.

There can be 120 double errors and 16 single errors for a total of 136 error patterns in an ECC word of 16 bits. Associated with these 136 error patterns are 136 distinct correctable error (CE) syndromes. Let SCE be the set CE syndromes. SCE can be divided into two subsets: the set of 16 single error syndromes SCE1 and the set of 120 double error syndromes SCE2. The elements of SCE1 are the column vectors of HGEN and the elements of SCE2 are the XORs of all possible pairs of the column vectors of HGEN.

Let sp be the parity of the syndrome of the received data. The number of errors in the received data is odd if sp is one, and the number of errors is even if sp is zero. Thus, if sp is one, the syndrome is matched against the elements of SCE1 to see if there is a single error. If sp is zero and the syndrome is not all zero, the syndrome is matched against the elements of SCE2 to see if there are two errors. If (sp=1) and (syndrome does not belong to SCE1), or (sp=0) and (syndrome does not belong to SCE2) and (syndrome is not all zero), then there are uncorrectable errors (UE).

The set of all non-zero CE syndromes can be grouped into 16 subsets G(i), i=1 . . . 16, so that if the errors are correctable and the syndrome belongs to G(i), bit position i is in error. The elements of G(i) consist of the column i of HGEN plus the XOR of column i and any other columns of HGEN. There are 16 elements in each of G(i). Referring to FIG. 2, 136 9-way AND circuits 204 can be used to determine if the syndrome is an element of SCE, excluding the all zero syndrome from the CE syndrome set. The inputs to each AND circuit 204 are either positive or negative phases of the syndrome bits. The 7 16-way OR circuits 210 generate error indicators for all data bits. The inputs to each OR circuit 210 are the outputs of the AND circuits 204. The received data 240 are inverted by XORing each data bit with the error indicators output from the OR circuits 210 using XOR circuits 212. UE detect 214 sets UE 216 if ((syndrome parity 218 output from the XOR circuit 208 is set) and (syndrome does not belong to SCE1)), or ((syndrome parity 218 is not set) and (syndrome does not belong to SCE2) and (syndrome is not all zero)). Corrected bits 2-7 are used for outputting a corrected 6-bit SBC command, which may also be referred to as an SBC pattern until the pattern has statically persisted for a sufficient period of time to determine that it is an SBC command.

Figure 3:
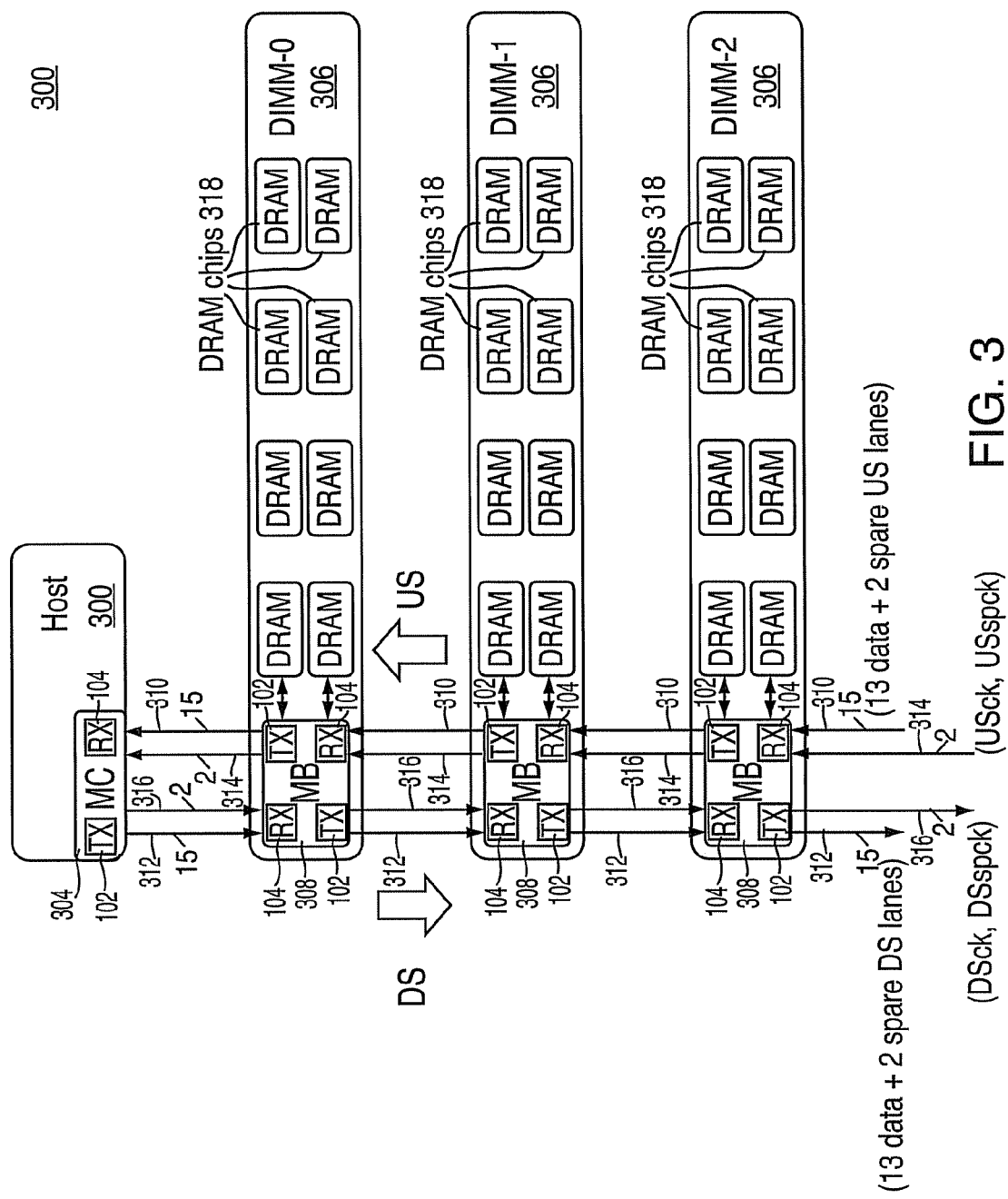
FIG. 3 depicts a memory system that includes fully buffered DIMMs communicating via high-speed upstream and downstream busses using error correcting code protected quasi-static bit communication that may be implemented by exemplary embodiments.

Turning now to FIG. 3, an example of memory system 300 that includes fully buffered dual in-line memory modules (DIMMs) communicating via high-speed upstream and downstream links using error correcting code protected quasi-static bit communication is depicted. A host processing system 302 includes a memory controller (MC) 304 and a number of DIMMs 306 as part of the memory system 300. Each DIMM 306 includes a memory buffer (MB) 308 that receives and drives 15 data lanes, both in upstream (US) and downstream (DS) directions. In an exemplary embodiment, the US busses 310 and DS busses 312 include 2 spare lanes; thus, only 13 of the 15 lanes are needed for the high-speed transmission of commands, address and data, as the 2 spare lanes can be used to replace up to 2 failed lanes. A high-speed clock and spare high-speed clock are sent in both the upstream and downstream directions as upstream clock lanes 314 and downstream clock lanes 316. The MC 304 and the MBs 308 include the transmitting circuitry 102 and receiving circuitry 104, and thus are examples of apparatuses for practicing the invention. Each of the DIMMs 306 can include multiple dynamic random access memory (DRAM) chips 318, as well as other components known in the art, e.g., resistors, capacitors, etc.

While the memory system 300 of FIG. 3 includes 15 US and DS lanes for the US and DS busses 310 and 312, the number of lanes can vary between US and DS lanes. For example, the DS bus 312 may include 20 lanes with 2 spares, while the US bus 310 includes 15 lanes with 2 spares. In such a mismatch, the SBC mode can utilize the lesser number of lanes for both US and DS communication. Additionally, when fewer than all lanes are utilized for SBC mode, lane rotation may be employed to test the unused lanes. Alternatively, the unused lanes can serve as additional spares.

Although only a single memory channel is shown in FIG. 3 connecting the MC 304 to a single MB 308, systems produced with these modules may include more than one discrete memory channel from the memory controller, with each of the memory channels operated singly (when a single channel was populated with modules) or in parallel (when two or more channels where populated with modules) to achieve the desired system functionality and/or performance.

The SBC command bits may be encoded and decoded as shown in the following table:

TABLE 1

Example SBC Commands

| SBC(5:0) | DS coding | US coding |
|---|---|---|
| 000000 | NOP | NOP |
| 000100 | TrainingState0_DSck | Reserved |
| 000101 | TrainingState0_DSspck | Reserved |
| 000110 | TrainingState0_USck | Reserved |
| 000111 | TrainingState0_USspck | Reserved |
| 001000 | TrainingState2_announce | TrainingState2_acknowledge |
| 001001 | TrainingState3_announce | TrainingState3_acknowledge |

TABLE 1-continued

Example SBC Commands

| SBC(5:0) | DS coding | US coding |
|---|---|---|
| 001010 | TrainingState4_announce | TrainingState4_acknowledge |
| 1cdddd | TrainingState_[clock,data] | TrainingState_[clock,data] |
| 011111 | TrainingState_done | TrainingState_done |
| Others | Reserved | Reserved |

In this example, the SBC command is used to start and acknowledge a number of training states during startup of the memory system 300 or after a reset condition. For TrainingState0 (clock detection and repair), the clock lane used for the forwarded clock on a given link segment is also indicated, where DSck stands for "use downstream default clock lane" of downstream clock lanes 316, and USspck stands for "use upstream spare clock lane" of upstream clock lanes 314, etc. Cascaded US acknowledge SBC code signals to the host processing system 302 that all downstream MBs 308 are ready for a given training state. At the end of a training state, the command TrainingState_done cascades downstream and upstream through the MC 304 and MBs 308. The SBC FSM/command encoding logic 118 handling a certain training state decides whether an SBC command is terminated in the MB 308 (e.g., at the SBC receiver logic 128 in the same MB 308) or forwarded to the driver 114 for cascading to another MB 308 or the MC 304.

During training states the data bus on each link segment (US bus 310 and/or DS bus 312) can enter a high-speed mode for various tasks such as impedance trimming, offset trimming, lane training (signal analysis, phase locking, equalization, bit error rate optimization), scrambler/descrambler synchronization, lane-to-lane deskewing and first-in-first-out (FIFO) optimization. After final bit lock and packet lock have been achieved, the SBC logic (e.g., SBC transmission logic 116 and/or SBC receiver logic 128) can be disabled (or even powered down) during the remaining training states and during normal high-speed operation.

Some training states require the exchange of data between transmitters and receivers of a link segment, such as lane repair vectors indicating failed lanes and spare lanes to be used on each segment of the daisy chain, trimming parameters or equalization coefficients. For this purpose, the SBC code TrainingState_[clock,data] is used to transmit 4 bits of data (dddd) per SBC. Larger data blocks can be continuously transmitted by using the c bit as a pseudo-clock indicating even and odd SBC cycles.

In one embodiment, the memory system 300 utilizes the following values while operating in the SBC mode: N0=256 UI, N1=128 UI (32 SBC samples), and N2=4 UI. Thus, for this example, the SBC transmission logic 116 of the transmitting circuitry 102 drives an unscrambled static bit pattern for 256 UI and the SBC receiver logic 128 of the receiving circuitry 104 detects patterns on the US bus 310 and/or the DS bus 312 that are stable for at least 128 UI (32 SBC samples). To allow for up to 2 defective lanes, only 13 lanes need to be stable for N1 UIs, whereas the other lanes are forced to a value of 0. In case less than 13 lanes are stable for N1 UIs, all received SBC bits are forced to the value of 0 (decoded as SBC NOP). The SBC receiver logic 128 latches channel content every 4 UIs, where the UIs are in reference to the high-speed clocks on the upstream clock lanes 314 and downstream clock lanes 316. Thereby, the SBC samples are captured in parallel to normal, high-speed frame samples used to access the DRAM chips 318.

Figure 4:
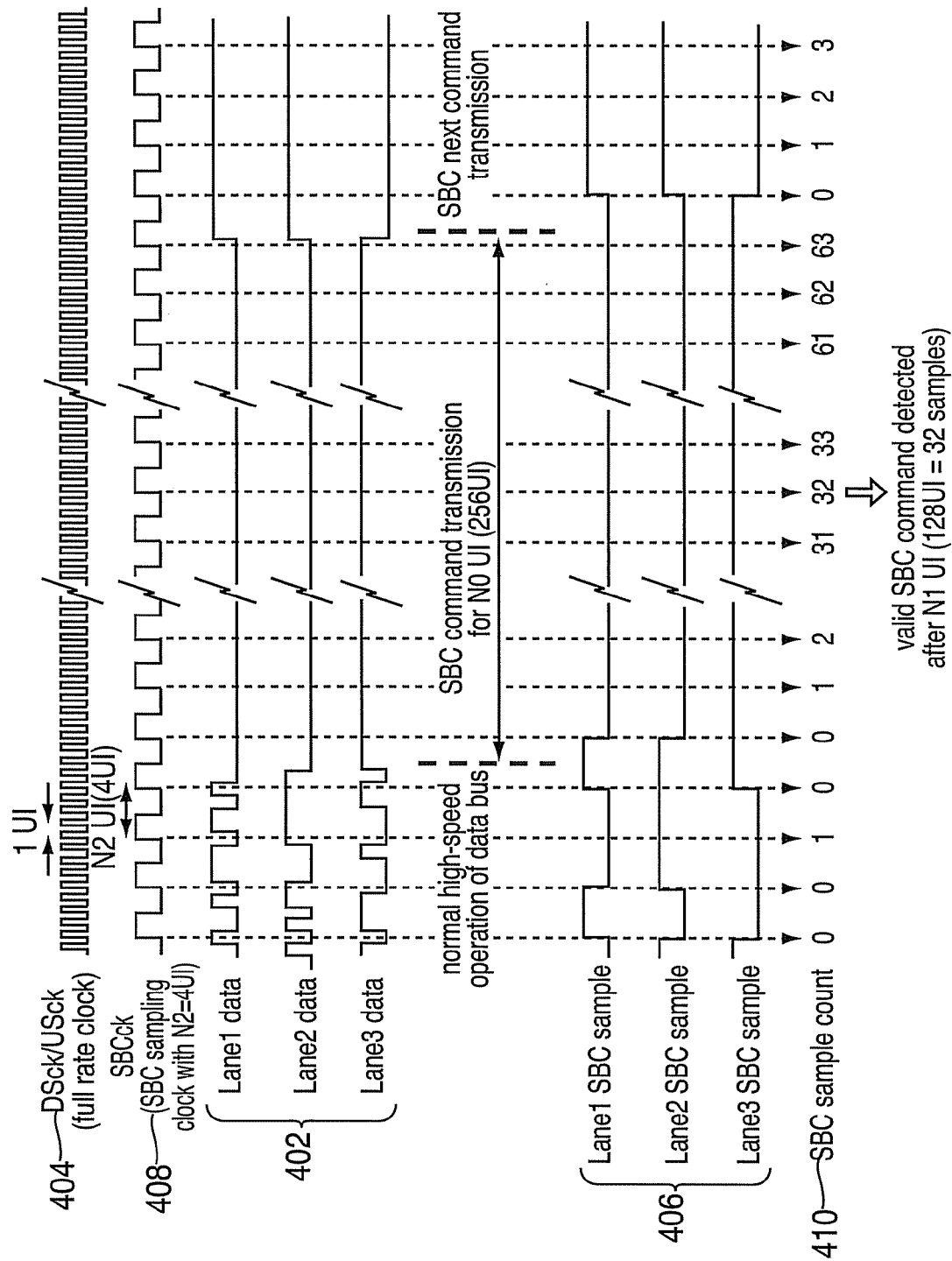
FIG. 4 depicts exemplary timing of high-speed data versus SBC data with respect to clock signals that may be implemented by exemplary embodiments.

FIG. 4 illustrates a timing diagram that further describes the relationships between normal high-speed operation and SBC operation in the memory system 300 of FIG. 3. For ease of explanation only 3 lanes are depicted in FIG. 4, which may represent US lanes or DS lanes. Lanes 1-3 402 depict example data sampled in reference to full rate clock 404, e.g., USck or DSck of upstream clock lanes 314 and downstream clock lanes 316. Lanes 1-3 406 are SBC samples of the same data on lanes 1-3 402, but are sampled with the reduced rate of SBC sampling clock (SBCck) 404. SBC samples for are counted as SBC sample count 410, which may be incorporated in the SBC FSM/command decoding logic 144 of the receiving circuitry 104, as long as the pattern on at least 13 lanes does not change. A valid SBC command is detected after N1 UI (N1/N2 SBC samples) of unchanged patterns.

Figure 5:
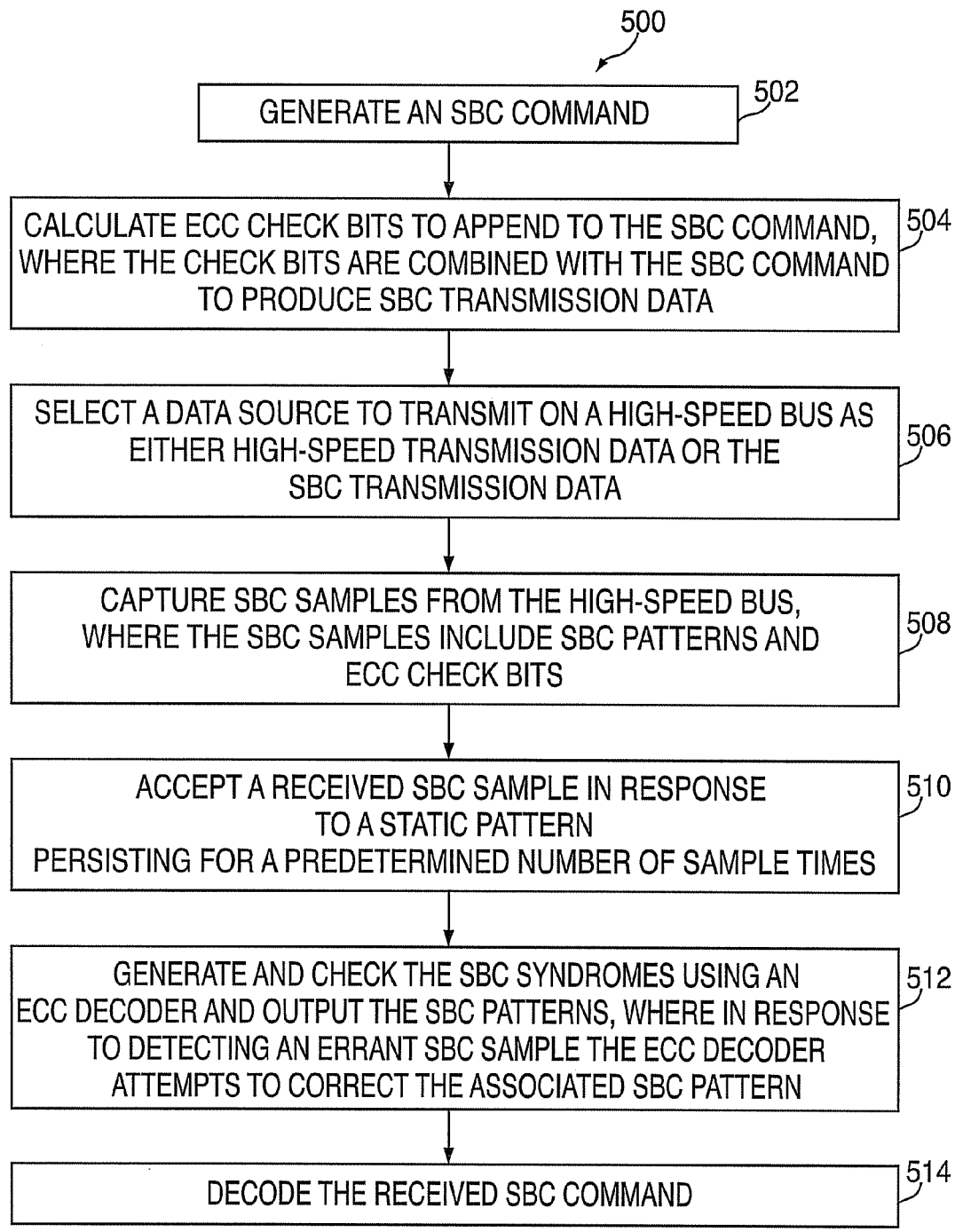
FIG. 5 depicts an exemplary process for providing error correcting code protected quasi-static bit communication that may be implemented by exemplary embodiments.

FIG. 5 depicts a process 500 for providing error correcting code protected quasi-static bit communication that may be implemented by an exemplary embodiment as described in reference to FIGS. 1 and 3. For example, the process 500 may be implemented in the MC 304 and/or the MBs 308 of FIG. 3. At block 502, the SBC transmission logic 116 generates an SBC command. The SBC command can be a "start training state" command to perform calibration or lane repair using one or more spare lanes, such as spare lanes of US and DS busses 310 and 312, as well as spare upstream and downstream clocks of upstream clock lanes 314 and downstream clock lanes 316. Calibration can include a variety of optimization tasks that affect signaling parameters such as phase locking, impedance trimming, scrambling, deskewing, equalization and other such adjustments to improve high-speed data reliability.

At block 504, the SBC transmission logic 116 calculates ECC check bits to append to the SBC command. The check bits are combined with the SBC command to produce SBC transmission data. At block 506, the mux 108 selects a data source to transmit on the high-speed link 106 (which may be US bus 310 or DS bus 312) as either high-speed data 110 or the SBC data 112 for transmission. The SBC transmission logic 116 can drive the selection using SBC mode control 122.

At block 508, the SBC receiver logic 128 captures SBC samples from the high-speed link 106 using the SBC sampling logic 140. The SBC samples include ECC check bits and SBC patterns. If there are no errors and the transmitting circuitry 102 is operating in SBC mode, then the received ECC check bits are equal to the transmitted check bits, and a received SBC pattern is equal to a transmitted SBC command. However, there may be inequalities if an error occurred or the transmitting circuitry 102 actually sent high-speed data, such as a memory access command.

At block 510, the SBC FSM/command decoding logic 144 detects a received SBC command in response to a static pattern persisting in the SBC patterns for a predetermined number of the SBC samples. For example, when the SBC pattern persists for N1 unit intervals, the SBC pattern is determined to be an SBC command that can be further decoded; however, if the pattern changes before the predetermined number of the SBC samples are counted, then the SBC pattern is not treated as an actual SBC command. This prevents high-speed commands from being interpreted as SBC commands since both can be sent on the same high-speed link 106. Parallel sampling for high-speed data 132 can be performed while capturing SBC data, although the slower SBC sampling clock 136 may be used by the SBC sampling logic 140 to ease timing closure.

At block 512, the ECC decoder and syndrome generator 142 checks the SBC syndromes from received check bits and outputs the SBC patterns. In response to detecting an errant SBC sample, the ECC decoder and syndrome generator 142 attempts to correct the associated SBC pattern. For example, the ECC decoder and syndrome generator 142 may be able to correct up to 2 bit errors, and detect 3 bit errors but not correct the 3 bit errors. The SBC pattern, corrected or uncorrected, is passed to the SBC FSM/command decoding logic 144 for further processing. The ECC decoder and syndrome generator 142 may also notify the SBC FSM/command decoding logic 144 of any uncorrected errors.

At block 514, the SBC FSM/command decoding logic 144 decodes the received SBC command. The SBC command can trigger a number of events that support initialization and configuration of communication interfaces as previously described.

Figure 6:
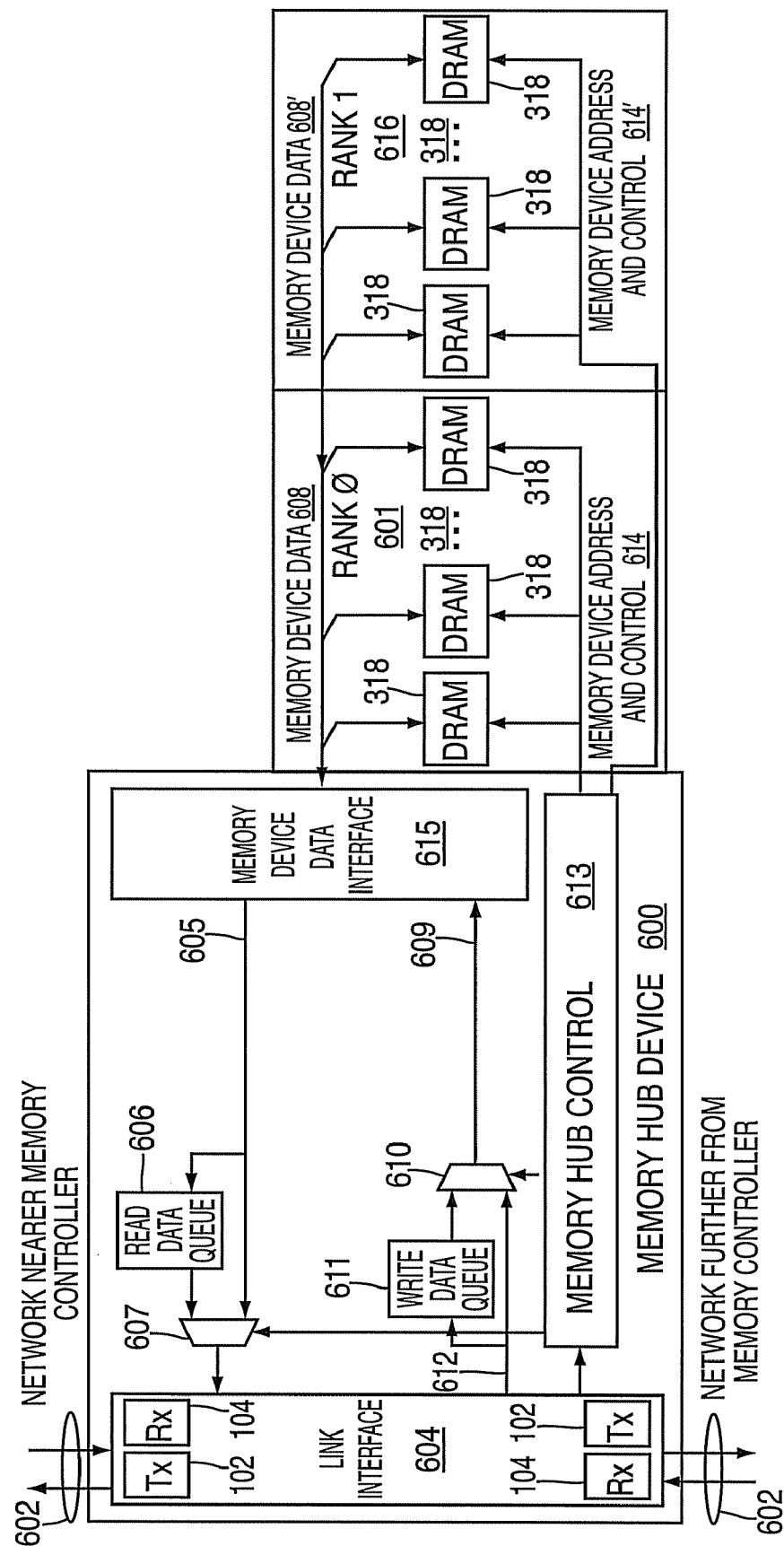
FIG. 6 depicts a memory hub device coupled with multiple ranks of memory devices that may be implemented by exemplary embodiments.

FIG. 6 depicts a block diagram of an exemplary memory hub device 600 including a link interface 604 for providing the means to re-synchronize, translate and re-drive high speed memory access information to associated DRAM devices 318 and/or to re-drive the information downstream on memory bus 602 as applicable based on the memory system protocol. The architecture depicted in FIG. 6 may be planar or integrated on a DIMM. The memory hub device 600 is a type of memory buffer device, such as the MB 308 of FIG. 3. The memory hub device 600 supports multiple ranks of DRAM 318 as separate groupings of memory devices using a common hub. The link interface 604 includes transmitting circuitry 102 and receiving circuitry 104 to support SBC communication with ECC protection in upstream and downstream directions on memory bus 602. Data, which may include SBC commands or high-speed data, are received by the link interface 604 from an upstream memory hub device 600 or from memory controller 304 (directly or via an upstream memory hub device controller 600) via the memory bus 602. The memory device data interface 615 manages the technology-specific data interface with the memory devices 318 and controls the bi-directional memory data bus 608. The memory hub control 613 responds to access request packets by responsively driving the memory device 318 technology-specific address and control bus 614 (for memory devices in Rank 0 601) or address and control bus 614' (for memory devices in Rank 1 616) and directing the read data flow 607 and write data flow 610 selectors. The link interface 604 decodes the packets and directs the address and command information directed to the local hub device 600 to the memory hub control 613. Memory write data from the link interface 604 can be temporarily stored in the write data queue 611 or directly driven to the memory devices 318 via the write data flow selector 610 and internal bus 612, and then sent via internal bus 609 and memory device data interface 615 to memory device data bus 608. Memory read data from memory device(s) 318 can be queued in the read data queue 606 or directly transferred to the link interface 604 via internal bus 605 and read data selector 607, to be transmitted on the upstream bus 602 as a read reply packet.

Figure 7:
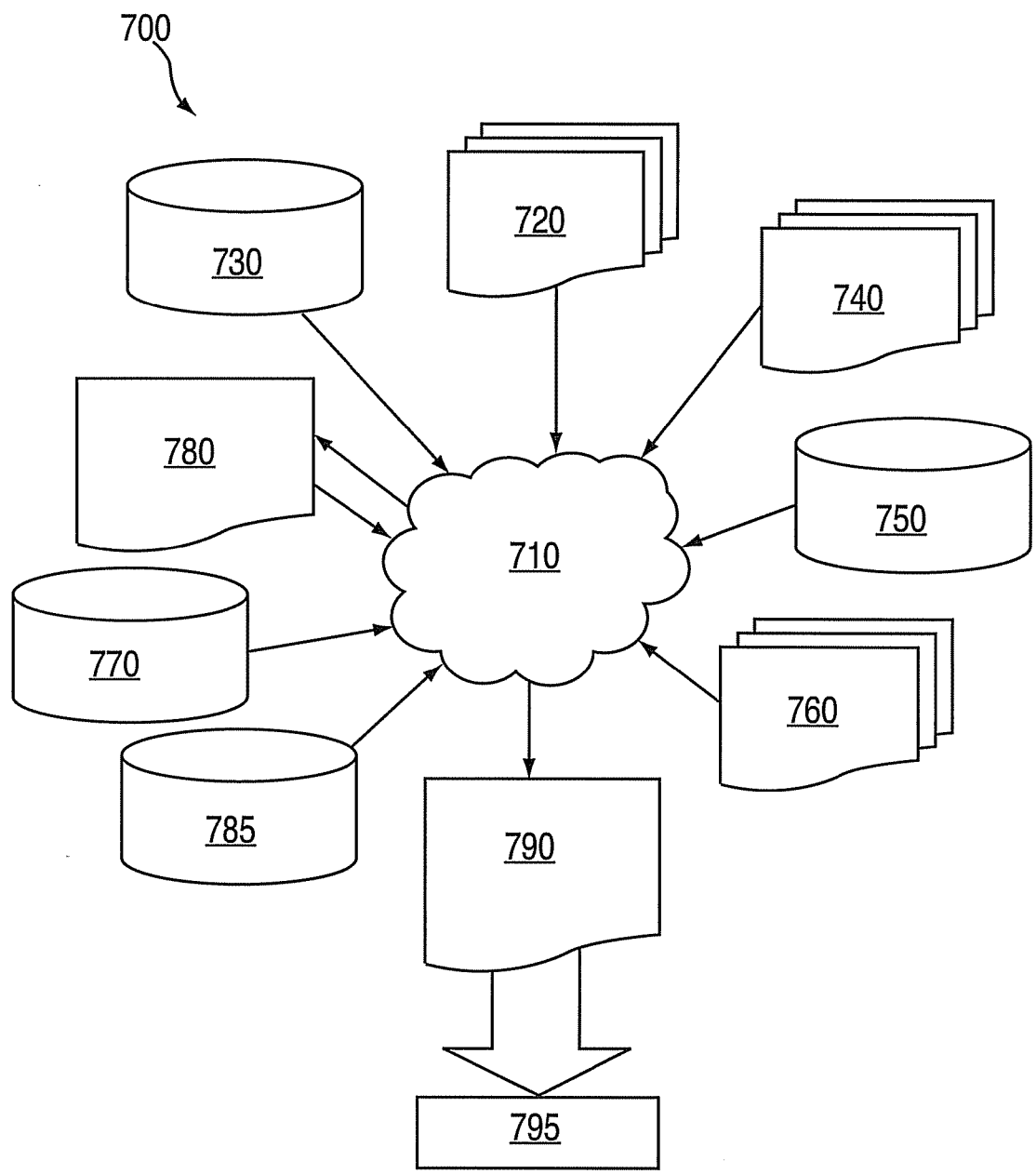
FIG. 7 is a flow diagram of a design process used in semiconductor design, manufacture, and/or test.

FIG. 7 shows a block diagram of an exemplary design flow 700 used for example, in semiconductor IC logic design, simulation, test, layout, and manufacture. Design flow 700 includes processes and mechanisms for processing design structures or devices to generate logically or otherwise functionally equivalent representations of the design structures and/or devices described above and shown in FIGS. 1-6. The design structures processed and/or generated by design flow 700 may be encoded on machine readable transmission or storage media to include data and/or instructions that when executed or otherwise processed on a data processing system generate a logically, structurally, mechanically, or otherwise functionally equivalent representation of hardware components, circuits, devices, or systems. Design flow 700 may vary depending on the type of representation being designed. For example, a design flow 700 for building an application specific IC (ASIC) may differ from a design flow 700 for designing a standard component or from a design flow 700 for instantiating the design into a programmable array, for example a programmable gate array (PGA) or a field programmable gate array (FPGA) offered by Altera® Inc. or Xilinx® Inc.

FIG. 7 illustrates multiple such design structures including an input design structure 720 that is preferably processed by a design process 710. Design structure 720 may be a logical simulation design structure generated and processed by design process 710 to produce a logically equivalent functional representation of a hardware device. Design structure 720 may also or alternatively comprise data and/or program instructions that when processed by design process 710, generate a functional representation of the physical structure of a hardware device. Whether representing functional and/or structural design features, design structure 720 may be generated using electronic computer-aided design (ECAD) such as implemented by a core developer/designer. When encoded on a machine-readable data transmission, gate array, or storage medium, design structure 720 may be accessed and processed by one or more hardware and/or software modules within design process 710 to simulate or otherwise functionally represent an electronic component, circuit, electronic or logic module, apparatus, device, or system such as those shown in FIGS. 1-6. As such, design structure 720 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 710 preferably employs and incorporates hardware and/or software modules for synthesizing, translating, or otherwise processing a design/simulation functional equivalent of the components, circuits, devices, or logic structures shown in FIGS. 1-6 to generate a netlist 780 which may contain design structures such as design structure 720. Netlist 780 may comprise, for example, compiled or otherwise processed data structures representing a list of wires, discrete components, logic gates, control circuits, I/O devices, models, etc. that describes the connections to other elements and circuits in an integrated circuit design. Netlist 780 may be synthesized using an iterative process in which netlist 780 is resynthesized one or more times depending on design specifications and parameters for the device. As with other design structure types described herein, netlist 780 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 710 may include hardware and software modules for processing a variety of input data structure types including netlist 780. Such data structure types may reside, for example, within library elements 730 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 740, characterization data 750, verification data 760, design rules 770, and test data files 785 which may include input test patterns, output test results, and other testing information. Design process 710 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 710 without deviating from the scope and spirit of the invention. Design process 710 may also include modules for performing standard circuit design processes such as timing analysis, verification, design rule checking, place and route operations, etc.

Design process 710 employs and incorporates logic and physical design tools such as HDL compilers and simulation model build tools to process design structure 720 together with some or all of the depicted supporting data structures along with any additional mechanical design or data (if applicable), to generate a second design structure 790. Design structure 790 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 720, design structure 790 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-6. In one embodiment, design structure 790 may comprise a compiled, executable HDL simulation model that functionally simulates the devices shown in FIGS. 1-6.

Design structure 790 may also employ a data format used for the exchange of layout data of integrated circuits and/or symbolic data format (e.g. information stored in a GDSII (GDS2), GL1, OASIS, map files, or any other suitable format for storing such design data structures). Design structure 790 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-6. Design structure 790 may then proceed to a stage 795 where, for example, design structure 790: proceeds to tape-out, is released to manufacturing, is released to a mask house, is sent to another design house, is sent back to the customer, etc.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The capabilities of the present invention can be implemented in software, firmware, hardware or some combination thereof.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Exemplary embodiments include a computing system with one or more processors and one or more I/O units (e.g., requestors) interconnected to a memory system that contains a memory controller and one or more memory devices. In exemplary embodiments, the memory system includes a processor or memory controller communicating with one or more hub devices (also referred to as "hub chips") which are attached to one or more ports or channels of the memory controller. The memory controller channels may be operated in parallel, thereby providing an increased data bus width and/or effective bandwidth, operated separately, or a combination therein as determined by the application and/or system design. The hub devices connect and interface to the memory devices either by direct connection (e.g. wires) or by way of one or more intermediate devices such as external buffers, registers, clocking devices, conversion devices, etc. In exemplary embodiments the computer memory system includes a physical memory array comprised of one or more volatile and/or non-volatile storage devices for storing such information as data and instructions. In exemplary embodiments, the hub-based computer memory system has memory devices attached to a communication hub device that is connected to a memory control device (e.g., a memory controller). Also in exemplary embodiments, the hub device is located on a memory module (e.g, a single substrate or assembly that includes two or more hub devices that are cascaded interconnected to each other (and may further connect to another hub device located on another memory module) via the cascade interconnect, daisy chain and/or other memory bus structure.

Hub devices may be connected to the memory controller through a multi-drop or point-to-point bus structure (which may further include a cascade connection to one or more additional hub devices). Memory access requests are transmitted by the memory controller through the bus structure (e.g., the memory bus) to the selected hub(s). In response to receiving the memory access requests, the hub device receives and generally translates and re-drives at least a portion of the received information in the memory access request(s) to the memory devices to initiate such operations as the storing of "write" data from the hub device or to provide "read" data to the hub device. Data read from the memory device(s) is generally encoded into one or more communication packet(s) and transmitted through the memory bus(es) to the memory controller or other requester—although the data may also be used by one or more of the hub devices (e.g. during memory "self-testing") or by another device having access to the hub, such as a service processor, test equipment, etc.

In alternate exemplary embodiments, the memory controller(s) may be integrated together with one or more processor chips and supporting logic, packaged in a discrete chip (commonly called a "northbridge" chip), included in a multi-chip carrier with the one or more processors and/or supporting logic, or packaged in various alternative forms that best match the application/environment. Any of these solutions may or may not employ one or more narrow/high speed links (e.g. memory channels or ports) to connect to one or more hub chips and/or memory devices.

The memory modules may be implemented by a variety of technologies including a dual in-line memory module (DIMM), a single in-line memory module (SIMM), a triple in-line memory module (TRIMM), and quad in-line memory module (QUIMM), various "small" form-factor modules (such as small outline DIMMs (SO DIMMs), micro DIMMs, etc) and/or other memory module or card structures. In general, a DIMM refers to a circuit board which is often comprised primarily of random access memory (RAM) integrated circuits or die on one or both sides of the board, with signal and/or power contacts also on both sides, along one edge of the board that are generally have different functionality that the directly and/or diagonally opposed contacts. This can be contrasted to a SIMM which is similar is composition but having opposed contacts electrically interconnected and therefore providing the same functionality as each other. For TRIMMs and QUIMMs, at least one side of the board includes two rows on contacts, with other board types having contacts on multiple edges of the board (e.g. opposing and/or adjacent edges on the same side of the board), in areas away from the board edge, etc. Contemporary DIMMs includes 168, 184, 240, 276 and various other signal pin or pad counts, whereas past and future memory modules will generally include as few as tens of contacts to hundreds of contacts. In exemplary embodiments described herein, the memory modules may include one, two or more hub devices.

In exemplary embodiments, the memory bus is constructed using point-to-point connections between hub devices and/or a hub device and the memory controller, although other bus structures such as multi-drop busses may also be used. When separate "upstream" and "downstream" (generally unidirectional) busses are utilized (together comprising the memory "bus"), the "downstream" portion of the memory bus, referred to as the downstream bus, may include command, address, data and other operational, initialization or status information being sent to one or more of the hub devices that are downstream of the memory controller. The receiving hub device(s) may simply forward the information to the subsequent hub device(s) via bypass circuitry; receive, interpret and re-drive the information if it is determined by the hub(s) to be targeting a downstream hub device; re-drive some or all of the information without first interpreting the information to determine the intended recipient; or perform a subset or combination of these functions.

The upstream portion of the memory bus, referred to as the upstream bus, returns requested read data and/or error, status or other operational information, and this information may be forwarded to the subsequent hub devices and/or the memory control device(s) via bypass circuitry; be received, interpreted and re-driven if it is determined by the hub(s) to be targeting an upstream hub device and/or memory controller in the processor complex; be re-driven in part or in total without first interpreting the information to determine the intended recipient; or perform a subset or combination of these functions.

In alternate exemplary embodiments, the point-to-point bus includes a switch, re-drive or bypass mechanism which results in the bus information being directed to one of two or more possible hub devices during downstream communication (communication passing from the memory controller to a hub device on a memory module), and which may also direct upstream information (communication from a hub device on a memory module toward the memory controller), often by way of one or more upstream hub devices. Further embodiments include the use of continuity modules, such as those recognized in the art, which, for example, can be placed between the memory controller and a first populated memory module (e.g., a memory module that includes a hub device that is in communication with one or more memory devices), in a cascade interconnect memory system, such that any intermediate module positions between the memory controller and the first populated memory module includes a means by which information passing between the memory controller and the first populated memory module device can be received even if the one or more intermediate module position(s) do not include a hub device. The continuity module(s) may be installed in any module position(s), subject to any bus restrictions, including the first position (closest to the main memory controller, the last position (prior to any included termination) or any intermediate position(s). The use of continuity modules may be especially beneficial in a multi-module cascade interconnect bus structure, where an intermediate hub device on a memory module is removed and replaced by a continuity module, such that the system continues to operate after the removal of the intermediate hub device/module. In more common embodiments, the continuity module(s) would include either interconnect wires to transfer all required signals from the input(s) to the corresponding output(s), or be re-driven through a repeater device. The continuity module(s) might further include a non-volatile storage device (such as an EEPROM), but would not include conventional main memory storage devices such as one or more volatile memory device(s). In other exemplary embodiments, the continuity or re-drive function may be comprised as a hub device that is not placed on a memory module (e.g. the one or more hub device(s) may be attached directly to the system board or attached to another carrier), and may or may not include other devices connected to it to enable functionality.

In exemplary embodiments, the memory system includes one or more hub devices on one or more memory modules connected to the memory controller via one or more cascade interconnect memory buses, however one or more other bus structure(s) or a combination of bus structures may be implemented to enable communication such as point-to-point bus(es), multi-drop bus(es) or other shared or parallel bus(es), often allow various means of communication (e.g. including both high speed and low speed communication means). Depending on the signaling methods used, the intended operating frequency range, space, power, cost, and other constraints, various alternate bus structures may also be considered. A point-to-point bus may provide optimal performance (e.g. maximum data rate) in systems produced with high frequency signaling utilizing electrical interconnections, due to the reduced signal degradation that may occur as compared to bus structures having branched signal lines (such as "T" nets, multi-drop nets or other forms of "stubs". However, when used in systems requiring communication with a large number of devices and/or memory subsystems, this method will often result in significant added component cost, increased latency for distant devices and/or increased system power, and may further reduce the total memory density in a given volume of space due to the need for intermediate buffering and/or re-drive of the bus(es).

Although generally not shown in the Figures, the memory modules or hub devices may also include one or more separate bus(es), such as a "presence detect" (e.g. a module serial presence detect bus), an I2C bus, a JTAG bus, an SMBus or other bus(es) which are primarily used for one or more purposes such as the determination of the hub device an/or memory module attributes (generally after power-up), the configuration of the hub device(s) and/or memory subsystem(s) after power-up or during normal operation, bring-up and/or training of the high speed interfaces (e.g. bus(es)), the reporting of fault or status information to the system and/or testing/monitoring circuitry, the determination of specific failing element(s) and/or implementation of bus repair actions such as bitlane and/or segment sparing, the determination of one or more failing devices (e.g. memory and/or support device(s)) possibly with the invoking of device replacement (e.g. device "sparing"), parallel monitoring of subsystem operation or other purposes, etc. The one or more described buses would generally not be intended for primary use as high speed memory communication bus(es). Depending on the bus characteristics, the one or more bus(es) might, in addition to previously described functions, also provide a means by which the valid completion of operations and/or failure identification could be reported by the hub devices and/or memory module(s) to the memory controller(s), the processor, a service processor, a test device and/or other functional element permanently or temporarily in communication with the memory subsystem and/or hub device.

In other exemplary embodiments, performances similar to those obtained from point-to-point bus structures can be obtained by adding switch devices to the one or more communication bus(es). These and other solutions may offer increased memory packaging density at lower power, while otherwise retaining many of the characteristics of a point-to-point bus. Multi-drop busses provide an alternate solution, albeit often limiting the maximum operating frequency to a frequency lower than that available with the use of an optimized point-to-point bus structure, but at a cost/performance point that may otherwise be acceptable for many applications. Optical bus solutions may permit significantly increased frequency and bandwidth vs. the previously-described bus structures, using point-to-point or multi-drop or related structures, but may incur cost and/or space impacts when using contemporary technologies.

As used herein the term "buffer" or "buffer device" refers to an interface device which includes temporary storage circuitry (such as when used in a computer), especially one that accepts information at one rate (e.g. a high data rate) and delivers it another (e.g. a lower data rate), and vice versa. Data rate multipliers of 2:1, 4:1, 5:1, 6:1, 8:1, etc. may be utilized in systems utilizing one or more buffer device(s) such as those described herein, with such systems often supporting multiple data rate multipliers—generally on a per-port basis. In exemplary embodiments, a buffer is an electronic device that provides compatibility between two signals (e.g. one or more of changing voltage levels, converting data rates, etc.). The term "hub" may be used interchangeably with the term "buffer" in some applications. A hub is generally described as a device containing multiple ports that enable connection to one or more devices on each port. A port is a portion of an interface that serves a congruent I/O functionality (e.g., in the exemplary embodiment, a port may be utilized for sending and receiving information such as data, address, command and control information over one of the point-to-point links (which may further be comprised of one or more bus(es)), thereby enabling communication with one or more memory devices. A hub may further be described as a device that connects several systems, subsystems, or networks together, and may include logic to merge local data into a communication data stream passing through the hub device. A passive hub may simply forward messages, while an active hub, or repeater, may amplify, re-synchronize and/or refresh a stream of data (e.g. data packets) which otherwise would deteriorate in signal quality over a distance. The term hub device, as used herein, refers primarily to one or more active devices that also include logic (including hardware and/or software) for directly and/or indirectly connecting to and communicating with one or more memory device(s) utilizing one communication means to another communication means (e.g. one or more of an upstream and downstream bus and/or other bus structure). The hub device may further include one or more traditional "memory controller" functions such as the conversion of high-level address and/or commands into technology-specific memory device information, scheduling and/or re-ordering of memory operations, the inclusion of local data caching circuitry and/or include other traditional memory controller and/or memory system functions.

Also as used herein, the term "bus" refers to one of the sets of conductors (e.g., wires, printed circuit board traces or other connection means) between devices, cards, modules and/or other functional units. The data bus, address bus and control signals, despite their names, generally constitute a single bus since each are often useless without the others. A bus may include a plurality of signal lines, each signal line having two or more connection points that form a transmission path that enables communication between two or more transceivers, transmitters and/or receivers. The term "channel", as used herein, refers to the one or more busses containing information such as data, address(es), command(s) and control(s) to be sent to and received from a system or subsystem, such as a memory, processor or I/O system. Note that this term is often used in conjunction with I/O or other peripheral equipment; however the term channel has also been utilized to describe the interface between a processor or memory controller and one of one or more memory subsystem(s).

Further, as used herein, the term "daisy chain" refers to a bus wiring structure in which, for example, device A is wired to device B, device B is wired to device C, etc. . . . . . The last device is typically wired to a resistor or terminator. All devices may receive identical signals or, in contrast to a simple bus, each device may modify, re-drive or otherwise act upon one or more signals before passing them on. A "cascade" or cascade interconnect' as used herein refers to a succession of stages or units or a collection of interconnected networking devices, typically hubs, in which the hubs operate as a logical repeater, further permitting merging data to be concentrated into the existing data stream. The terms daisy chain and cascade connect may be used interchangeably when a daisy chain structure includes some form of re-drive and/or "repeater" function. Also as used herein, the term "point-to-point" bus and/or link refers to one or a plurality of signal lines that may each include one or more terminators. In a point-to-point bus and/or link, each signal line has two transceiver connection points, with each transceiver connection point coupled to transmitter circuitry, receiver circuitry or transceiver circuitry. A signal line refers to one or more electrical conductors, optical carriers and/or other information transfer method, generally configured as a single carrier or as two or more carriers, in a twisted, parallel, or concentric arrangement, used to transport at least one logical signal.

Memory devices are generally defined as integrated circuits that are comprised primarily of memory (storage) cells, such as DRAMs (Dynamic Random Access Memories), SRAMs (Static Random Access Memories), FeRAMs (Ferro-Electric RAMs), MRAMs (Magnetic Random Access Memories), ORAMs (optical random access memories), Flash Memories and other forms of random access and/or pseudo random access storage devices that store information in the form of electrical, optical, magnetic, biological or other means. Dynamic memory device types may include asynchronous memory devices such as FPM DRAMs (Fast Page Mode Dynamic Random Access Memories), EDO (Extended Data Out) DRAMs, BEDO (Burst EDO) DRAMs, SDR (Single Data Rate) Synchronous DRAMs, DDR (Double Data Rate) Synchronous DRAMs, QDR (Quad Data Rate) Synchronous DRAMs, Toggle-mode DRAMs or any of the expected follow-on devices such as DDP2, DDR3, DDR4 and related technologies such as Graphics RAMs, Video RAMs, LP RAMs (Low Power DRAMs) which are often based on at least a subset of the fundamental functions, features and/or interfaces found on related DRAMs.

Memory devices may be utilized in the form of chips (die) and/or single or multi-chip packages of various types and configurations. In multi-chip packages, the memory devices may be packaged with other device types such as other memory devices, logic chips, analog devices and programmable devices, and may also include passive devices such as resistors, capacitors and inductors. These packages may include an integrated heat sink or other cooling enhancements, which may be further attached to the immediate carrier or another nearby carrier or heat removal system.

Module support devices (such as buffers, hubs, hub logic chips, registers, PLL's, DLL's, non-volatile memory, etc) may be comprised of multiple separate chips and/or components, may be combined as multiple separate chips onto one or more substrates, may be combined onto a single package and/or or integrated onto a single device—based on technology, power, space, cost and other tradeoffs. In addition, one or more of the various passive devices such as resistors, capacitors may be integrated into the support chip packages and/or into the substrate, board or raw card itself, based on technology, power, space, cost and other tradeoffs. These packages may also include one or more heat sinks or other cooling enhancements, which may be further attached to the immediate carrier or be part of an integrated heat removal structure that contacts more than one support and/or memory devices.

Memory devices, hubs, buffers, registers, clock devices, passives and other memory support devices and/or components may be attached to the memory subsystem via various methods including solder interconnects, conductive adhesives, socket assemblies, pressure contacts and other methods which enable communication between the two or more devices and/or carriers via electrical, optical or alternate communication means.

The one or more memory modules, memory cards and/or alternate memory subsystem assemblies and/or hub devices may be electrically connected to the memory system, processor complex, computer system or other system environment via one or more methods such as soldered interconnects, connectors, pressure contacts, conductive adhesives, optical interconnects and other communication and power delivery methods. Inter-connection systems may include mating connectors (e.g. male/female connectors), conductive contacts and/or pins on one carrier mating with a compatible male or female connection means, optical connections, pressure contacts (often in conjunction with a retaining mechanism) and/or one or more of various other communication and power delivery methods. The interconnection(s) may be disposed along one or more edges of the memory assembly, may include one or more rows of interconnections and/or be located a distance from an edge of the memory subsystem depending on such application requirements as the connection structure, the number of interconnections required, performance requirements, ease of insertion/removal, reliability, available space/volume, heat transfer/cooling, component size and shape and other related physical, electrical, optical, visual/physical access, etc. Electrical interconnections on contemporary memory modules are often referred to as contacts, pins, tabs, etc. Electrical interconnections on a contemporary electrical connector are often referred to as contacts, pads, pins, pads, etc.

As used herein, the term memory subsystem refers to, but is not limited to one or more memory devices, one or more memory devices and associated interface and/or timing/control circuitry and/or one or more memory devices in conjunction with a memory buffer, hub device, and/or switch. The term memory subsystem may also refer to a storage function within a memory system, comprised of one or more memory devices in addition to one or more supporting interface devices and/or timing/control circuitry and/or one or more memory buffers, hub devices or switches, identification devices, etc.; generally assembled onto one or more substrate(s), card(s), module(s) or other carrier type(s), which may further include additional means for attaching other devices. The memory modules described herein may also be referred to as memory subsystems because they include one or more memory devices and other supporting device(s).

Additional functions that may reside local to the memory subsystem and/or hub device include write and/or read buffers, one or more levels of local memory cache, local pre-fetch logic (allowing for self-initiated pre-fetching of data), data encryption/decryption, compression/de-compression, address and/or command protocol translation, command prioritization logic, voltage and/or level translation, error detection and/or correction circuitry on one or more busses, data scrubbing, local power management circuitry (which may further include status reporting), operational and/or status registers, initialization circuitry, self-test circuitry (testing logic and/or memory in the subsystem), performance monitoring and/or control, one or more co-processors, search engine(s) and other functions that may have previously resided in the processor, memory controller or elsewhere in the memory system. Memory controller functions may also be included in the memory subsystem such that one or more of non-technology-specific commands/command sequences, controls, address information and/or timing relationships can be passed to and from the memory subsystem, with the subsystem completing the conversion, re-ordering, re-timing between the non-memory technology-specific information and the memory technology-specific communication means as necessary. By placing more technology-specific functionality local to the memory subsystem, such benefits as improved performance, increased design flexibility/extendibility, etc., may be obtained, often while making use of unused circuits within the subsystem.

Memory subsystem support device(s) may be directly attached to the same substrate or assembly onto which the memory device(s) are attached, or may be mounted to a separate interposer, substrate, card or other carrier produced using one or more of various plastic, silicon, ceramic or other materials which include electrical, optical or other communication paths to functionally interconnect the support device(s) to the memory device(s) and/or to other elements of the memory subsystem or memory system.

Information transfers (e.g. packets) along a bus, channel, link or other interconnection means may be completed using one or more of many signaling options. These signaling options may include one or more of such means as single-ended, differential, optical or other communication methods, with electrical signaling further including such methods as voltage and/or current signaling using either single or multi-level approaches. Signals may also be modulated using such methods as time or frequency, non-return to zero, phase shift keying, amplitude modulation and others. Signal voltage levels are expected to continue to decrease, with 1.5V, 1.2V, 1V and lower signal voltages expected, as a means of reducing power, accommodating reduced technology breakdown voltages, etc.—in conjunction with or separate from the power supply voltages. One or more power supply voltages, e.g. for DRAM memory devices, may drop at a slower rate that the I/O voltage(s) due in part to the technological challenges of storing information in the dynamic memory cells.

One or more clocking methods may be utilized within the memory subsystem and the memory system itself, including global clocking, source-synchronous clocking, encoded clocking or combinations of these and other methods. The clock signaling may be identical to that of the signal (often referred to as the bus "data") lines themselves, or may utilize one of the listed or alternate methods that is more conducive to the planned clock frequency(ies), and the number of clocks required for various operations within the memory system/subsystem(s). A single clock may be associated with all communication to and from the memory, as well as all clocked functions within the memory subsystem, or multiple clocks may be sourced using one or more methods such as those described earlier. When multiple clocks are used, the functions within the memory subsystem may be associated with a clock that is uniquely sourced to the memory subsystem and/or may be based on a clock that is derived from the clock included as part of the information being transferred to and from the memory subsystem (such as that associated with an encoded clock). Alternately, a unique clock may be used for the information transferred to the memory subsystem, and a separate clock for information sourced from one (or more) of the memory subsystems. The clocks themselves may operate at the same or frequency multiple of the communication or functional frequency, and may be edge-aligned, center-aligned or placed in an alternate timing position relative to the data, command or address information.

Information passing to the memory subsystem(s) will generally be composed of address, command and data, as well as other signals generally associated with requesting or reporting status or error conditions, resetting the memory, completing memory or logic initialization and/or other functional, configuration or related operations. Information passing from the memory subsystem(s) may include any or all of the information passing to the memory subsystem(s), however generally will not include address and command information. The information passing to or from the memory subsystem(s) may be delivered in a manner that is consistent with normal memory device interface specifications (generally parallel in nature); however, all or a portion of the information may be encoded into a 'packet' structure, which may further be consistent with future memory interfaces or delivered using an alternate method to achieve such goals as an increase communication bandwidth, an increase in memory subsystem reliability, a reduction in power and/or to enable the memory subsystem to operate independently of the memory technology. In the latter case, the memory subsystem (e.g. the hub device) would convert and/or schedule, time, etc. the received information into the format required by the receiving device(s).

Initialization of the memory subsystem may be completed via one or more methods, based on the available interface busses, the desired initialization speed, available space, cost/complexity, the subsystem interconnect structures involved, the use of alternate processors (such as a service processor) which may be used for this and other purposes, etc. In one embodiment, the high speed bus may be used to complete the initialization of the memory subsystem(s), generally by first completing a step-by-step training process to establish reliable communication to one, more or all of the memory subsystems, then by interrogation of the attribute or 'presence detect' data associated the one or more various memory assemblies and/or characteristics associated with any given subsystem, and ultimately by programming any/all of the programmable devices within the one or more memory subsystems with operational information establishing the intended operational characteristics for each subsystem within that system. In a cascaded system, communication with the memory subsystem closest to the memory controller would generally be established first, followed by the establishment of reliable communication with subsequent (downstream) subsystems in a sequence consistent with their relative position along the cascade interconnect bus.

A second initialization method would include one in which the high speed bus is operated at one frequency during the initialization process, then at a second (and generally higher) frequency during the normal operation. In this embodiment, it may be possible to initiate communication with any or all of the memory subsystems on the cascade interconnect bus prior to completing the interrogation and/or programming of each subsystem, due to the increased timing margins associated with the lower frequency operation.

A third initialization method might include operation of the cascade interconnect bus at the normal operational frequency(ies), while increasing the number of cycles associated with each address, command and/or data transfer. In one embodiment, a packet containing all or a portion of the address, command and/or data information might be transferred in one clock cycle during normal operation, but the same amount and/or type of information might be transferred over two, three or more cycles during initialization. This initialization process would therefore be using a form of 'slow' commands, rather than 'normal' commands, and this mode might be automatically entered at some point after power-up and/or re-start by each of the subsystems and the memory controller by way of POR (power-on-reset) logic and/or other methods such as a power-on-rest detection via detection of a slow command identifying that function.

A fourth initialization method might utilize a distinct bus, such as a presence detect bus (such as the one defined in U.S. Pat. No. 5,513,135 to Dell et al., of common assignment herewith), an I2C bus (such as defined in published JEDEC standards such as the 168 Pin DIMM family in publication 21-C revision 7R8) and/or the SMBUS, which has been widely utilized and documented in computer systems using such memory modules. This bus might be connected to one or more modules within a memory system in a daisy chain/cascade interconnect, multi-drop or alternate structure, providing an independent means of interrogating memory subsystems, programming each of the one or more memory subsystems to operate within the overall system environment, and adjusting the operational characteristics at other times during the normal system operation based on performance, thermal, configuration or other changes desired or detected in the system environment.

Other methods for initialization can also be used, in conjunction with or independent of those listed. The use of a separate bus, such as described in the fourth embodiment above, also provides an independent means for both initialization and uses other than initialization, such as described in U.S. Pat. No. 6,381,685 to Dell et al., of common assignment herewith, including changes to the subsystem operational characteristics on-the-fly and for the reporting of and response to operational subsystem information such as utilization, temperature data, failure information or other purposes.

With improvements in lithography, better process controls, the use of materials with lower resistance, increased field sizes and other semiconductor processing improvements, increased device circuit density (often in conjunction with increased die sizes) may facilitate increased function on integrated devices as well as the integration of functions previously implemented on separate devices. This integration can serve to improve overall performance of the memory system and/or subsystem(s), as well as provide such system benefits as increased storage density, reduced power, reduced space requirements, lower cost, higher performance and other manufacturer and/or customer benefits. This integration is a natural evolutionary process, and may result in the need for structural changes to the fundamental building blocks associated with systems.

The integrity of the communication path, the data storage contents and all functional operations associated with each element of a memory system or subsystem can be assured, to a high degree, with the use of one or more fault detection and/or correction methods. Any or all of the various elements may include error detection and/or correction methods such as CRC (Cyclic Redundancy Code), EDC (Error Detection and Correction), parity or other encoding/decoding methods suited for this purpose. Further reliability enhancements may include operation re-try (to overcome intermittent faults such as those associated with the transfer of information), the use of one or more alternate or replacement communication paths and/or portions of such paths (e.g. "segments" of end-to-end "bitlanes") between a given memory subsystem and the memory controller to replace failing paths and/or portions of paths, complement-re-complement techniques and/or alternate reliability enhancement methods as used in computer, communication and related systems.

The use of bus termination, on busses ranging from point-to-point links to complex multi-drop structures, is becoming more common consistent with increased performance demands. A wide variety of termination methods can be identified and/or considered, and include the use of such devices as resistors, capacitors, inductors or any combination thereof, with these devices connected between the signal line and a power supply voltage or ground, a termination voltage (such voltage directly sourced to the device(s) or indirectly sourced to the device(s) from a voltage divider, regulator or other means), or another signal. The termination device(s) may be part of a passive or active termination structure, and may reside in one or more positions along one or more of the signal lines, and/or as part of the transmitter and/or receiving device(s). The terminator may be selected to match the impedance of the transmission line, be selected as an alternate impedance to maximize the useable frequency, signal swings, data widths, reduce reflections and/or otherwise improve operating margins within the desired cost, space, power and other system/subsystem limits.

Technical effects and benefits include providing error correcting code protected quasi-static bit communication on a high-speed bus. The error correcting code can both detect and correct errors on received SBC commands. When incorporated in a cascade interconnected memory system, transmitting and receiving logic supporting SBC can be included in memory hub devices and a memory controller to pass training information between memory modules at a slower speed relative to the nominal operation at high-speed. Using a detection scheme for identifying that a sufficient number of signals have remained static for a pre-determined period of time allows SBC data to be sampled in parallel to high-speed data and distinguished from the high-speed data. ECC protection as well as the ability to use spare lanes provides enhanced error protection. Since the SBC clock is a slower clock derived from a high speed clock, sampling of SBC data is less susceptible to precision issues with timing as compared with the high-speed data, and thus can be reliable without requiring PLL adjustments and the like.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated. Moreover, the use of the terms first, second, etc. do not denote any order or importance, but rather the terms first, second, etc. are used to distinguish one element from another.

What is claimed is:

1. A communication interface device comprising:
   high-speed sampling logic to capture high-speed data from a high-speed bus using a high-speed sampling clock;
   static bit communication (SBC) sampling logic to capture SBC samples from the high-speed bus using an SBC sampling clock, wherein the SBC sampling clock is slower than the high-speed sampling clock;
   an SBC finite state machine (FSM) to detect a received SBC command in response to a static pattern persisting for a predetermined number of the SBC samples; and
   command decoding logic to decode the received SBC command,
   wherein the high-speed bus is one of an upstream bus and a downstream bus to communicate with a second communication interface device, and the high-speed sampling clock is received via one of upstream clock lanes and downstream clock lanes, and
   wherein the upstream bus includes 13 upstream data lanes and 2 upstream spare lanes, the downstream bus includes 13 downstream data lanes and 2 downstream spare lanes, the upstream clock lanes include an upstream clock and an upstream spare clock, and the downstream clock lanes include a downstream clock and a downstream spare clock.

2. The communication interface device of claim 1 further comprising:
   an error correcting code (ECC) decoder to detect errors in the SBC samples, wherein in response to detecting an errant SBC sample the ECC decoder attempts to correct the errant portion of the SBC sample prior to passing the errant portion of the SBC sample to the SBC FSM, and notifies the SBC FSM if the errant SBC sample includes an uncorrectable error.

3. The communication interface device of claim 2 wherein the SBC samples include 15 bits, and the ECC is double error correcting and triple error detecting with a 9-bit syndrome.

4. The communication interface device of claim 1 wherein the communication interface device is one of a memory controller and a memory buffer to process memory access commands in the high-speed data.

5. The communication interface device of claim 1 further comprising:
   SBC transmission logic comprising:
      SBC command encoding logic to generate an SBC command;
      an ECC encoder to calculate ECC check bits to append to the SBC command, wherein the ECC check bits are combined with the SBC command to produce SBC transmission data; and
      a transmitting SBC FSM to output an SBC mode control; and
   a multiplexer to select a data source to transmit on a second high-speed bus as a function of the SBC mode control, wherein the multiplexer selects one of high-speed transmission data and the SBC transmission data.

6. The communication interface device of claim 1 wherein the received SBC command is a training state to perform one of: calibration, equalization and lane repair using one or more of the spare lanes.

7. A memory system comprising:
   a memory controller including transmitting circuitry, the transmitting circuitry comprising:
      static bit communication (SBC) transmission logic to generate SBC transmission data, wherein the SBC transmission data includes a static pattern held static for multiple unit intervals of a high-speed clock; and
      a multiplexer to select a data source to transmit as a one of high-speed transmission data and the SBC transmission data; and
   a memory buffer in communication with the memory controller via a high-speed bus, wherein the memory buffer includes receiving circuitry comprising:
      high-speed sampling logic to capture high-speed data from the high-speed bus using the high-speed clock as a high-speed sampling clock;
      SBC sampling logic to capture SBC samples from the high-speed bus using an SBC sampling clock, wherein the SBC sampling clock is slower than the high-speed sampling clock; and
      an SBC finite state machine (FSM) to detect a received SBC command in response to a received static pattern persisting for a predetermined number of the SBC samples,
   wherein the high-speed bus is a downstream bus and the second high-speed bus is an upstream bus, and further wherein the high-speed sampling clock is received at the memory buffer via downstream clock lanes and the high-speed sampling clock is received at the memory controller via the upstream clock lanes, and
   wherein the upstream bus includes 13 upstream data lanes and 2 upstream spare lanes, the downstream bus includes 13 downstream data lanes and 2 downstream spare lanes, the upstream clock lanes include an upstream clock and an upstream spare clock, and the downstream clock lanes include a downstream clock and a downstream spare clock.

8. The memory system of claim 7 further comprising:
   an error correcting code (ECC) encoder to calculate ECC check bits in the SBC transmission data;
   an ECC decoder to detect errors in the SBC samples, wherein in response to detecting an errant SBC sample the ECC decoder attempts to correct the errant portion of the SBC sample prior to passing the errant portion of the SBC sample to the SBC FSM, and notifies the SBC FSM if the errant SBC sample includes an uncorrectable error.

9. The memory system of claim 8 wherein the SBC transmission data include 15 bits, the SBC samples include 15 bits, and the ECC is double error correcting and triple error detecting with a 9-bit syndrome.

10. The memory system of claim 7 wherein the memory buffer controls access to memory devices and the high-speed data includes memory access commands.

11. The memory system of claim 7 wherein the memory controller further includes the receiving circuitry, and the memory buffer further includes the transmitting circuitry to communicate with the receiving circuitry of the memory controller via a second high-speed bus.

12. The memory system of claim 7 wherein the received SBC command is a start training state command to perform one of: calibration and lane repair using one or more of the spare lanes.

13. The memory system of claim 7 wherein the SBC sampling clock is an integer number of unit intervals (N2 UI) slower than the high-speed sampling clock, and the static pattern is held static for a greater number of unit intervals (N0 UI) than the predetermined number of the SBC samples in unit intervals (N1 UI).

14. A method for providing error correcting code protected quasi-static bit communication (SBC), the method comprising:
 capturing SBC samples from a high-speed bus, wherein the SBC samples include error correcting code (ECC) check bits and SBC patterns;
 capturing high-speed data from the high-speed bus using a high-speed sampling clock in parallel to capturing the SBC samples, wherein the SBC samples are captured using a SBC sampling clock that is slower than the high-speed sampling clock
 checking the ECC check bits using an ECC decoder and outputting the SBC patterns, wherein in response to detecting an errant SBC sample the ECC decoder attempts to correct the associated SBC pattern;
 detecting a received SBC command in response to a static pattern persisting in the SBC patterns for a predetermined number of the SBC samples; and
 decoding the received SBC command,
 wherein the high-speed bus is one of an upstream bus and a downstream bus to communicate with a communication interface device, and the high-speed sampling clock is received via one of upstream clock lanes and downstream clock lanes, and
 wherein the upstream bus includes 13 upstream data lanes and 2 upstream spare lanes, the downstream bus includes 13 downstream data lanes and 2 downstream spare lanes, the upstream clock lanes include an upstream clock and an upstream spare clock, and the downstream clock lanes include a downstream clock and a downstream spare clock.

15. The method of claim 14 wherein the received SBC command is a training state command to perform one of: calibration and lane repair using one or more of the spare lanes.

16. The method of claim 14 wherein the SBC patterns include 6 bits, the ECC check bits include 9 bits, and the ECC is double error correcting and triple error detecting.

17. The method of claim 14 further comprising:
 generating an SBC command;
 calculating the ECC check bits to append to the SBC command, wherein the ECC check bits are combined with the SBC command to produce SBC transmission data; and
 selecting a data source to transmit on the high-speed bus as one of high-speed transmission data and the SBC transmission data.

18. A design structure tangibly embodied in a machine-readable medium for designing, manufacturing, or testing an integrated circuit, the design structure comprising:
 high-speed sampling logic to capture high-speed data from a high-speed bus using a high-speed sampling clock;
 static bit communication (SBC) sampling logic to capture SBC samples from the high-speed bus using an SBC sampling clock, wherein the SBC sampling clock is slower than the high-speed sampling clock;
 an SBC finite state machine (FSM) to detect a received SBC command in response to a static pattern persisting for a predetermined number of the SBC samples; and
 command decoding logic to decode the received SBC command,
 wherein the high-speed bus is one of an upstream bus and a downstream bus to communicate with a second communication interface device, and the high-speed sampling clock is received via one of upstream clock lanes and downstream clock lanes, and
 wherein the upstream bus includes 13 upstream data lanes and 2 upstream spare lanes, the downstream bus includes 13 downstream data lanes and 2 downstream spare lanes, the upstream clock lanes include an upstream clock and an upstream spare clock, and the downstream clock lanes include a downstream clock and a downstream spare clock.

* * * * *